United States Patent [19]
Hamilton et al.

[11] 4,009,371
[45] Feb. 22, 1977

[54] AVERAGING COUNTER

[75] Inventors: Robert H. Hamilton; John L. Mohr, both of St. Louis County, Mo.

[73] Assignee: McDonnell Douglas Corporation, Long Beach, Calif.

[22] Filed: Mar. 3, 1975

[21] Appl. No.: 554,750

[52] U.S. Cl. .................. 235/92 LG; 235/92 CC; 235/92 CP; 235/92 VA; 235/92 R; 328/46

[51] Int. Cl.² ........................................ H03K 21/30

[58] Field of Search ..... 235/92 VA, 92 LG, 92 CP, 235/92 DM, 92 CC; 328/46

[56] References Cited
UNITED STATES PATENTS

| | | | |
|---|---|---|---|
| 3,409,761 | 11/1968 | Becker | 235/92 VA |
| 3,484,699 | 12/1969 | Israel | 328/46 |

*Primary Examiner*—Joseph M. Thesz
*Attorney, Agent, or Firm*—G. W. Finch; W. J. Jason; D. L. Royer

[57] ABSTRACT

An averaging counter for measuring the elapsed time between events comprising means whereby counting and adding together can be performed using a single counter such as a binary counter and associated control gating means to make the counter switch from one counting mode to another, said counter being able to count by factors which are not multiples of the basic counter modulus and said counter being able to simultaneously count and average.

12 Claims, 7 Drawing Figures

AVERAGING COUNTER

START SIGNAL          STOP SIGNAL
FIG.1
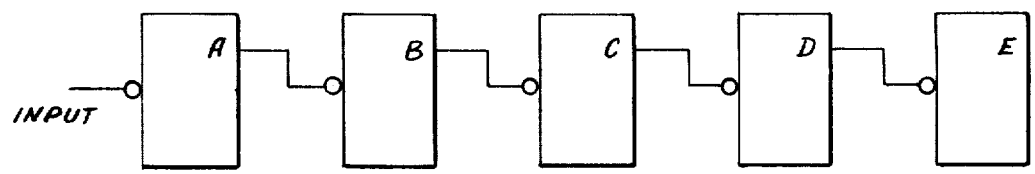
FIG.2
```
Assigned Value   1 2 4 8          Running Sum
                 A B C D
                 0 0 0 0              0
                 1 0 0 0              1
                 0 1 0 0              2
                 1 1 0 0              3
                 0 0 1 0              4
                 1 0 1 0              5
                 0 1 1 0              6
                 1 1 1 0              7
                 0 0 0 1              8
                 1 0 0 1              9
                 0 1 0 1             10
                 1 1 0 1             11
                 0 0 1 1             12
                 1 0 1 1             13
                 0 1 1 1             14
                 1 1 1 1             15
```
FIG.3
```
Assigned Value 1 2 4 8 16   Sum of A and B only   Running Sum
               A B C D E
               0 0 0 0 0             0                 0
               1 1 0 0 0             3                 3
               0 1 1 0 0             2                 6
               1 0 0 1 0             1                 9
               0 0 1 1 0             0                12
               1 1 1 1 0             3                15
               0 1 0 0 1             2                18
               1 0 1 0 1             1                21
               0 0 0 1 1             0                24
```
FIG.4

| | 1st | 2nd | 3rd | 4th | 1 A | 2 B | 4 C | 8 D | 16 E | 32 F | 64 G | |
|---|---|---|---|---|---|---|---|---|---|---|---|---|
| COUNT BY 4 | 0 | 0 | 0 | 0 | 0 | 0 | 0 | 0 | 0 | 0 | 0 | |
| | | | | | 0 | 0 | 1 | 0 | 0 | 0 | 0 | 4 |
| | | | | | 0 | 0 | 0 | 1 | 0 | 0 | 0 | 8 |
| | | | | | 0 | 0 | 1 | 1 | 0 | 0 | 0 | 12 |
| | | | | | 0 | 0 | 0 | 0 | 1 | 0 | 0 | 16 |
| | | | | | 0 | 0 | 1 | 0 | 1 | 0 | 0 | 20 |
| | | | | | 0 | 0 | 0 | 1 | 1 | 0 | 0 | 24 |
| | | | | | 0 | 0 | 1 | 1 | 1 | 0 | 0 | 28 |
| | | | | | 0 | 0 | 0 | 0 | 0 | 1 | 0 | 32 |
| COUNT BY 3 | 1 | 0 | 0 | 0 | 0 | 0 | 1 | 0 | 0 | 1 | 0 | 36 |
| | | | | | 1 | 1 | 1 | 0 | 0 | 1 | 0 | 39 |
| | | | | | 0 | 1 | 0 | 1 | 0 | 1 | 0 | 42 |
| | | | | | 1 | 0 | 1 | 1 | 0 | 1 | 0 | 45 |
| | | | | | 0 | 0 | 0 | 0 | 1 | 1 | 0 | 48 |
| | | | | | 1 | 1 | 0 | 0 | 1 | 1 | 0 | 51 |
| COUNT BY 2 | 1 | 1 | 0 | 0 | 0 | 1 | 1 | 0 | 1 | 1 | 0 | 54 |
| | | | | | 0 | 0 | 0 | 1 | 1 | 1 | 0 | 56 |
| | | | | | 0 | 1 | 0 | 1 | 1 | 1 | 0 | 58 |
| | | | | | 0 | 0 | 1 | 1 | 1 | 1 | 0 | 60 |
| | | | | | 0 | 1 | 1 | 1 | 1 | 1 | 0 | 62 |
| | | | | | 0 | 0 | 0 | 0 | 0 | 0 | 1 | 64 |
| | | | | | 0 | 1 | 0 | 0 | 0 | 0 | 1 | 66 |
| | | | | | 0 | 0 | 1 | 0 | 0 | 0 | 1 | 68 |
| COUNT BY 1 | 1 | 1 | 1 | 0 | 0 | 1 | 1 | 0 | 0 | 0 | 1 | 70 |
| | | | | | 1 | 1 | 1 | 0 | 0 | 0 | 1 | 71 |
| | | | | | 0 | 0 | 0 | 1 | 0 | 0 | 1 | 72 |
| | | | | | 1 | 0 | 0 | 1 | 0 | 0 | 1 | 73 |
| | | | | | 0 | 1 | 0 | 1 | 0 | 0 | 1 | 74 |
| | | | | | 1 | 1 | 0 | 1 | 0 | 0 | 1 | 75 |
| STOP | 1 | 1 | 1 | 1 | 0 | 0 | 1 | 1 | 0 | 0 | 1 | 76 |

AVERAGING COUNTER

There are many occassions when it is desired to measure the elapsed time between events. One way to do this is to use a digital counter which is started upon the occurrence of one event and stopped upon the occurrence of a succeeding event. Often it is also required to repeat the measurement at a rapid rate and in known devices the measurements which are made are transferred to a storage means while other similar measurements are made using the same counter. The present invention discloses a different approach which is able to make multiple measurements of elapsed time; i.e., have a common start signal but different stop signals. It is apparent that using this approach a separate counter could be used for each stop signal; for example all the separate counters are started simultaneously and stopped sequentially depending upon the arrival time of the respective second events. In such an approach, the amount accumulated in the counters are added together to arrive at an average of the elapsed time. The present disclosure covers a method whereby the counting and the adding together are performed in a single counter.

It is therefore a principal object of the present invention to control a single counter to count and to average.

Another object is to simplify the construction and reduce the cost of devices which can be used as averaging counters.

Another object is to provide means to control bi-stable counter means to increment by different multiples such as to increment by multiples of 1, 2, 3, 4 and so on.

Another object is to provide means to control a binary counter which can control the counter whereby the counter can produce output averages and at different rates depending upon the purpose for which the counter is used.

Another object is to teach the construction and operation of a novel variable sequence counter.

Another object is to enlarge the operating capability of a counter by enabling it to count by numbers which are not necessarily multiples of a basic counter modulus.

Another object is to control a binary counter device whereby it can simultaneously count and average.

These and other objects and advantages of the present invention will become apparent after considering the following detailed specification which describes several different embodiments of the subject device in conjunction with the accompanying drawings, wherein:

FIG. 1 is a simplified diagram of a single start multiple stop signal counting arrangement;

FIG. 2 is a block diagram of a multiple stage binary counter for use in the present device;

FIG. 3 is a chart showing various states of the binary stages of the counter of FIG. 2;

FIG. 4 shows the states of the stages of a binary counter such as the binary counter of FIG. 2 when controlled to count by 3s;

Figures 5, 6:
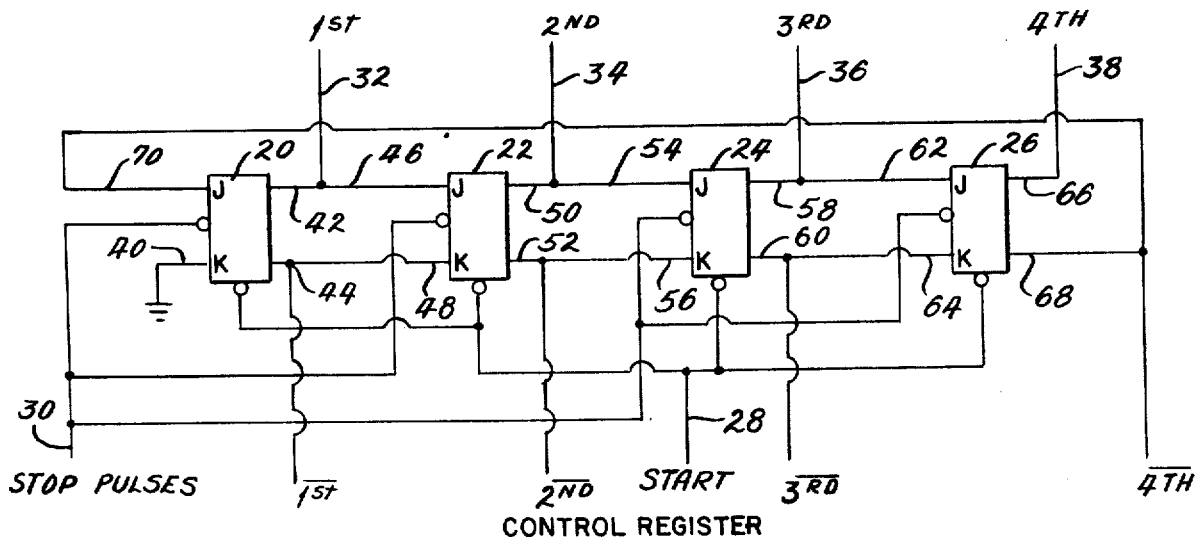
FIG. 5 is a table showing the states of the stages of a seven stage binary counter similar to the binary counter of FIG. 2 wherein the counter is able to be controlled to count by 4s, by 3s, by 2s and by 1s.
Figure 7:
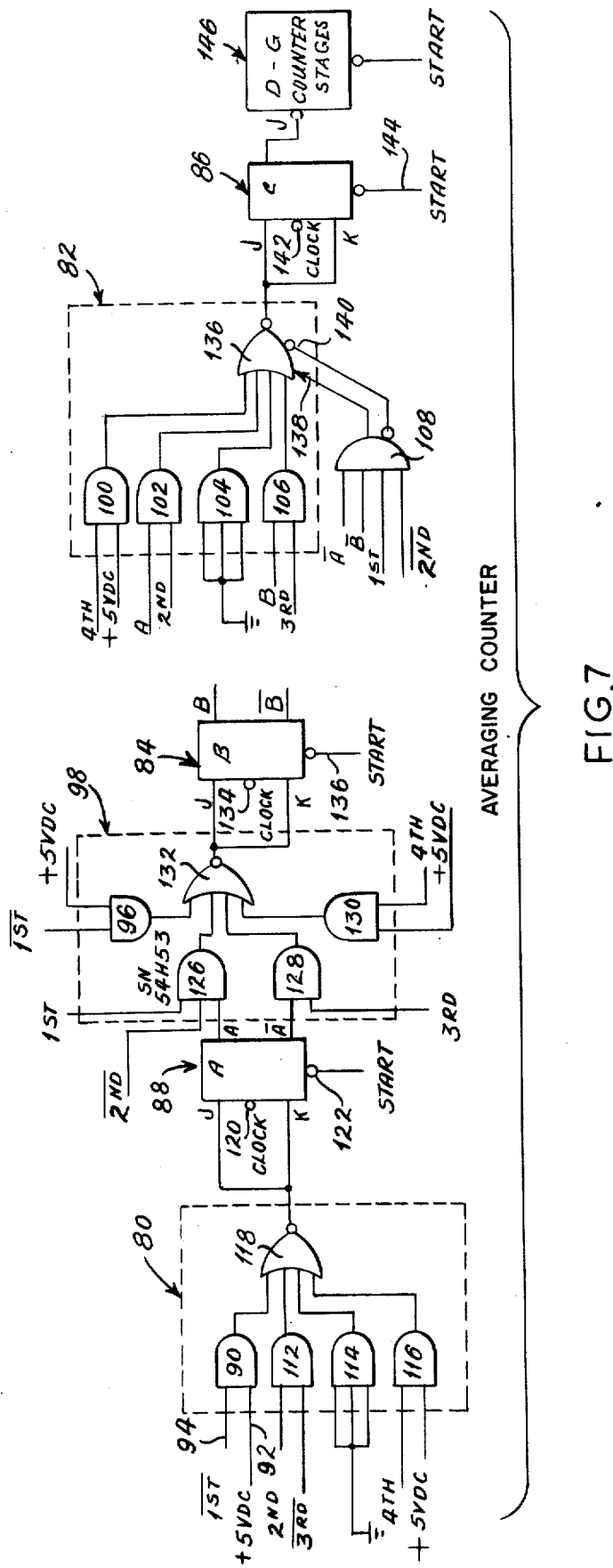

FIG. 6 is a simplified block diagram showing a control register required to generate control signals to enable a binary counter such as the averaging counter to count in the manner shown by the table of FIG. 5; and FIG. 7 should be considered with FIG. 6 and is a schematic block diagram showing other of the controls for controlling an averaging counter constructed according to the present invention.

Referring to the drawings more particularly by reference numbers, FIG. 1 illustrates a situation where it is desired to measure the elapsed time for a plurality of different events. A typical way to do this is to start a digital counter with one event and stop it on a succeeding event. In this situation it is necessary to provide one counter for each event to be measured or to repeat the measurements at a rapid rate moving each new measurement into some form of storage while making another measurement using the same or a different counter. Any way this is done requires several different components including counters and/or storage means as well as means for transferring information from one to the other. The present application teaches a different approach using different means to make multiple measurements of elapsed time.

In FIG. 1 a single input signal starts a plurality of measurements each taking place in a different counter, and a plurality or burst of stop signals, one for each elapsed time period being measured, is required. From what has been said this can be accomplished using several different counters all started at the same time, but each responding to a different stop signal. After all of the counters are stopped, their contents can then be added together to produce the averaging function. Averaging in this case involves finding the average of the amounts accumulated that represent the times of occurrence of the different stop signals. Such a procedure has application to many possible situations. For example, this procedure can be used to accurately measure range between several objects such as between several aircraft where the signal or signals from one aircraft for example may arrive at another aircraft at some later time taking into account their times of transmission and delays in their arrival times due to noise or interference or due to ground or atmosphere bounce or some other condition.

The present invention discloses means and a method using a single counter whereby the counting and adding together functions can be performed simultaneously. The advantages of being able to do this are many and varied including advantages in accuracy and reliability, advantages of circuit simplicity and in reduced circuit costs. Maintenance and other advantages including reduction in circuit size and use of relative trouble free parts are also realized.

To better understand the invention, the assumptions are made that (1) N elapsed time counters are started simultaneously, (2) each counter is incremented once every interval of time $\Delta t$, $\Delta t$ representing one unit of time or time increment such as a time increment between pulses from a clock source, and (3) that the counters are stopped sequentially by receipt of successive stop signals. Under these assumptions the sum accumulated by N counters will increase by N counts with the passage of each time interval $\Delta t$ until the first stop signal is received. From that point on until the next stop signal is received the sum accumulated by the counters is increased by N−1 counts with the passage of each time interval $\Delta t$, and so on until all of the counters have been stopped. If, on the other hand, a single counter is used which increments initially by N for each time interval $\Delta t$, (N being the number of increments or conditions being monitored) until the first stop signal, and thereafter by N−1 until the next stop signal is received, and so on until all of the stop signals have been received, the accumulated count in the one counter will be equivalent to the sum accumulated in N individual counters as in the first example. This can be expressed mathematically. The problem is to determine the sum, T, of n ordered values, $t_i$, as follows:

$$\{t_1, t_2, t_3, \ldots, t_n\}, \quad T = \sum_{i=1}^{n} t_i$$

If we let $\Delta t_j$ be the difference between the jth and $(j-1)$st value, then $$\Delta t_j = t_j - t_{j-1}, \quad t_o = 0,$$

$$t_i = \sum_{j=1}^{n} \Delta t_j$$

Therefore $$T = \sum_{i=1}^{n} \sum_{j=1}^{n} \Delta t_j$$

Interchanging the order of summation gives $$T = \sum_{j=1}^{n} \Delta t_j \sum_{i=j}^{n} (1) = \sum_{j=1}^{n} \Delta t_j (n - j + 1)$$

Therefore $$T = \sum_{j=1}^{n} (n - j + 1)(\Delta t_j)$$

a weighted sum of the differences.

Thus it can be seen that a single counter initially counting at a rate n for each time interval will count first at the rate n for each time interval $\Delta t$, then at n−1, then at n−2, etc. each time another stop signal is received, and a counter so programmed will produce the same output as will be produced by n counters all of which start counting simultaneously but which are stopped sequentially as indicated above.

FIG. 2 shows an example of a typical binary counter. The number of counter stages can be increased or decreased depending upon need, and the type of counters employed can also be varied. Such counters may be arranged and connected so that the output of each flip-flop stage changes only when its input changes from a high or 1 condition to a low or 0 condition. Therefore, whenever the input to the first stage flip-flop (A) changes from binary 1 to binary 0 the state of flip-flop (A) will also change. If all of the flip-flop stages (A–E) are initially set to 0 state, then when a first start signal arrives the states of the flip-flops will change in the manner and according to the sequence shown in FIG. 3. The top line in FIG. 3 is the value assigned to each stage of the counter, the second line identifies the counter stages, and the third line illustrates the reset condition in which all of the stages are in their binary 0 conditions. The first input signal which is an input binary 1 to the A stage will produce a binary 1 at the input of the first stage and as soon as this input changes back to a binary 0 condition the condition of the first or A stage will change from a binary 0 to a binary 1 condition. This is represented by the presence of a binary 1 at the output of the A stage. The next or second input will also appear on the input to the A stage and this input will operate to change the state of the output of the A stage from its binary 1 condition back to a binary 0 condition. This change in the output of the first stage will appear at the input to the second or B stage changing the state of the B stage from its binary 0 to a binary 1 condition as illustrated in the fifth line of the Chart in FIG. 3. This condition therefore represents two inputs which is the running sum and is represented by a binary 1 condition at the output of the B stage only. In like manner, the third input signal will again change the state of the A stage but will have no effect on the B stage so that after three inputs there will be binary 1s on both the A and B stages representing a total accumulation of three. Each subsequent input signal will advance the counter by one in the manner illustrated in FIG. 3. What is described in connection with FIGS. 2 and 3 is a usual way in which multi stage binary counters operate.

If it is desired to count by 4s instead of by 1s, this can be done simply and in a straightforward manner by by-passing the A and B stages and feeding the input signals directly to the input to the third or C stage. If it is desired to count by 2s the inputs would be fed to the input of the second stage B counter rather than to the input of the A counter and so on. However, if it is desired to count by 3s some additional controls will be necessary. The states of the flip-flops after receipt of each input in a count by three sequence is illustrated by the chart in FIG. 4.

In FIG. 4 the five stages of the counter are labeled A, B, C, D and E and the value represented by the respective stages is 1, 2, 4, 8 and 16. In a count by three situation i.e., analogous to the sum of 3 count by 1 counters which count simultaneously, the first two counter stages A and B must operate in a count-down mode, that is in a 3, 2, 1, 0 mode instead of in a count-up mode of 0, 1, 2, 3. Those skilled in the art can connect binary counters so they count down instead of counting up. In addition the third of C counter stage must change its state every time an input signal is received except times when the first two counter stages A and B both are at binary 0s. This can be implemented using standard logic gates. Except for these differences the counter operates in a usual manner.

In a circuit which is used in connection with the count by three table of FIG. 4 the five counter stages A–E are in their reset or zero condition when all have 0 outputs. The first input signal changes the A and B stages from binary 0s to binary 1s to represent an entry of three. The second input changes the A stage back to a binary 0 and also changes the state of the C stage from 0 to 1. This results in 1s at the outputs of the B and C stages representing an accumulation of six after receipt of only two input signals.

The third input to the counter (1) changes the state of the A stage from 0 to 1; (2) changes the B stage to 0; (3) changes the C stage back to a binary 0 condition; and (4) in so doing feeds an input to the D stage to change it from a binary 0 to a binary 1. Hence after three inputs, the A and D stages are at binary 1s representing a total accumulation of 9.

The fourth input (1) changes the state of the A stage to a binary 0; (2) produces no further change in the state of the B stage; (3) changes the C stage to a binary 1 condition; and (4) produces no output to change the stage of the D stage which at this time is also at binary 1. consequently, after receipt of the fourth input signal the counter will have binary 1s on its C and D stages representing a total counter value of 12. Succeeding inputs will produce similar changes which are manifested as outputs of 15, 18, 21, 24 and so on. The important thing is that the count by three mode just described is only one of several possible modes which responds to clock pulses, and as soon as the next succeeding stop signal is received circuit changes will take place to cause the counter to count by 2s and so on. The principles involved may be easier to understand if one considers that the present single counter is acting like a plurality of individual counters that are controlled to simultaneously start counting but which stop one at a time as each input signal is received.

FIG. 5 shows a table which illustrates the outputs available from a single counter which is programmed to count first by 4s, then 3s, then 2s, then 1s and finally stops. The table of FIG. 5 shows the single counter commencing counting by 4s when a start input signal is received. This is the same as energizing four counters to commence counting by 1s. The counter continues to count by 4s until the second input which is a stop input pulse is received whereupon it changes to counting by 3s in the manner just described and so on. A typical situation where the subject averaging counter might be used is in a device for measuring range or distance where the range is measured between cooperating units that are synchronized to each other. Perkinson et al U.S. Pat. No. 3,250,896 discloses a system where range is measured in this way. In such a system a range pulse of some predetermined duration is transmitted from each cooperating unit at some precise time. The range pulse is followed by a plurality of accurately spaced pulses. Such transmissions however are subject to noise, signal bounce and other conditions which may effect their times of arrivals. In such cases the range measurement may be affected and because of this it is highly desirable to be able to average the times of receipt of several different signals in order to produce an average value (which in more accurate than a single measurement) which can then be used as the range measurement. The present averaging counter is able to accomplish this with a high degree of measurement accuracy. It is very important in collision avoidance and other systems to be able to make accurate measurements of range and other parameters taking into account factors such as those just mentioned. It is not intended, however, to limit the present invention to any particular use or application since it has many possible uses in addition to range measurement. Some other applications where the subject averaging counter can be used include uses where multiple measurement of the time of arrival of signals is desired, wherever rate control involving counting at different rates is necessary, it can be used as a means to generate a signal which approximates some exponential function such as the function $y = e^x$ and the present averaging counter can be used as an events counter in commercial counter applications to improve the resolution characteristics. Other applications and uses are also possible and contemplated.

It is important to also recognize that the present averaging counter can count by numbers which are not multiples of the basic counter modulus, and it can perform counting and summing functions simultaneously in a single counter. Both of these features are novel to the present type construction and ones which contribute to the usefulness and accuracy thereof. Furthermore, and importantly, the present averaging counter can be made to have many different capacities and it can be made using well known and relatively available components including various well known type of gate circuits and flip-flop circuits, and it is adaptable to being made using integrated circuits.

FIGS. 6 and 7 should be considered together as they represent a schematic logic circuit diagram which when interconnected as will be described produce an averaging counter which is capable of counting by 4s, 3s, 2s, or 1s depending upon certain control settings. The averaging counter of FIGS. 6 and 7 includes a control portion which is shown in FIG. 6 and a gated binary counter control portion which is shown in FIG. 7. The sequence and the times at which the counting rate or counting mode is changed can be varied as required for a particular application. However, if the device is to operate as an averaging counter in the manner described it is necessary that the counting rate be reduced upon the receipt of each incoming signal. If the circuit were to be used for other than an averaging application it is possible that the counting rate could be changed from a lower to a higher counting rate as well as vise versa. This is possible using the present circuit but not if the counter is used as an averaging counter. In other words, the circuits of FIGS. 6 and 7 can be made to count at any desired counting rates and in any desired order of counting rates depending upon how the circuit controls are programmed. Furthermore, the basic principles of the circuit as shown can be applied to a counter which can count in other sequences and at other modes or rates such as counting by 5s, 6s, 7s, 8s and so forth. The advantages of being able to program a single counter so that it can count at any number of different rates in response to the receipt of input signals and can average are at the heart of the present invention.

The control portion of the counter circuit shown in FIG. 6 has four stages labeled as the 1st, 2nd, 3rd and 4th stages, and the counter controlled thereby has seven counting stages labeled A through G. The A stage counts by 1s, the B stage counts by 2s, the C stage by 4s and so on up to the G stage that counts by 64s. Part of the circuitry for the counter itself as well as for the control gates is shown in FIG. 7.

The control portion of the circuit shown in FIG. 6 includes four binary flip-flops 20, 22, 24 and 26. Each of the flip-flops has a first input terminal connected to an input signal source 28 which is labeled START, and signals received on the terminal 28 simultaneously resets flip-flops 20, 22, 24 and 26, i.e., causes outputs 42, 50, 58 and 66 to go to the zero state. This enables flip-flops A, B, C, D, E, F and G (of FIG. 7) to respond to the clock inputs at 120, 134 and 142. Referring again to FIG. 6, each stage also has a respective output connection 32, 34, 36 aand 38, and these outputs are labeled 1st, 2nd, 3rd and 4th outputs. These outputs are sometimes referred to as the real outputs and will be described more specifically in connection with the counter circuitry of FIG. 7.

Referring again to FIG. 6 the first stage flip-flop 20 has another input terminal 40 that is shown grounded and it has two output terminals 42 and 44 which are connected respectively to inputs 46 and 48 of the second stage flip-flop 22. In like manner, the second stage flip-flop 22 has two outputs 50 and 52 which are connected respectively to inputs 54 and 56 of the third stage flip-flop 24, and output terminals 58 and 60 of the flip-flop 24 are respectively connected to inputs 62 and 64 of the fourth stage flip-flop 26. One output 66 of the flip-flop 26 is connected as the 4th output lead 38 and the other output 68 of the fourth stage flip-flop 26 is used as a feedback connection to input 70 of the first stage flip-flop 20.

When the circuit of FIG. 6 is in its set condition with 1s on the 1st, 2nd, 3rd and 4th output connections, the counter portion of the circuit shown in FIG. 7 will be inactive. However, when a start signal is received on the input lead 28, the true outputs of the flip-flops 20–26 on terminals 32–38 are forced to the 0 state. Thereafter when the first rate change signal occurs on input lead 30 the output of the first stage flip-flop 20 changes so that the output on the lead 32 changes from 0 to 1. This condition enables the second stage flip-flop 22 to be able to change from 0 to 1 but it does not cause the change to take place until the 2nd input stop pulse is received on lead 30. In like manner, the change which occurs in the condition of the second stage flip-flop 22 enables the third stage flip-flop 24 to change from 0 to 1 on receipt of the third input stop pulse on lead 30, and the changed condition of the third stage makes it possible for the fourth stage 26 to change on receipt of the fourth input stop signal. After four stop pulses have been received, all four of the flip-flops 20–26 will have 1s on their true output terminals 32–38. This also means that the other output terminals 44, 52, 60 and 68 of the same flip-flops will all be 0s. These outputs are labeled the same as the true outputs but with a line or bar over them to indicate that they are the false outputs or that they have a complimentary relationship to the respective true outputs. The changes in the condition of the flip-flops 20–26 changes the counters shown in FIG. 7 by producing changes in the inputs to enable/inhibit gates 80 and 82. This in turn controls how the averaging counter will count. In the circuit as shown the counter will be controlled to count at the counting rates and in the order of counting rates as shown in the table of FIG. 5.

Specifically if, and only if, all of the inputs to an AND gate are at the 1 level will the output of the AND gate be at 1. When this condition occurs, it will cause the output of the associated enable/inhibit gate to be at 0 level. If the inputs to the j–k flip-flops are both at 1 the flip-flop output changes state every time the clock changes from 1 to 0. This means that there are 12 sets of controls, four each for flip-flops 84, 86 and 88, which can be used to change the rate at which the counter accumulates or counts. For example, after a start signal has been received on lead 28, but before a stop signal is received on input lead 30, the counter shown in FIG. 7 will be counting at a counting rate of four for each input clock pulse. This means that a flip-flop 88 and the flip-flop 84 are inhibited, and flip-flop 86 in enabled on every clock pulse. Flip-flop 88 is inhibited by operation of gate 90 which is located within the enable/inhibit gate 80. Input lead 92 to the gate 90 is permanently maintained at a 1 level while the other input lead 94 to the gate 90 which is connected to the false or complimentary output lead 44 of the flip-flop 20 ($\overline{1st}$) goes to a 1 when a start signal is received and thereafter drops to 0 when the first stop signal is received on lead 30. Hence, flip-flop 88 is inhibited until a stop pulse is received. Another AND gate 96 which is part of another enable/inhibit gate 98 has the same input connections as the gate 90 and this means that flip-flop 84 is inhibited at the same times as the flip-flop 88 is inhibited. To verify that the flip-flop 86, and all subsequent flip-flops are enabled at this time, it is sufficient to show that other AND gates 100, 102, 104, 106 and 108 have at least one input at the 0 level. These 0 level signals are the signals initially on the output terminals 32, 34, 36 and 38 of the flip-flops 20–26 in the control signal generator shown in FIG. 6. When stop signals are received on the input lead 30, the inputs to the enable/inhibit gates change and these changes cause the counting rate to change accordingly and according to the schedule shown in FIG. 5. In connection with FIG. 7 the inputs to the various AND gates are labeled to correspond to the outputs they are connected to in the control circuit of FIG. 6. For example, the real output of the flip-flop circuit 20 is labeled 1st and appears on lead 32. The complimentary output from the flip-flop 20 appears on lead 44 and is labeled $\overline{1st}$. It is in the nature of flip-flops that these two signals should always be different, that is when one of them has a 1 the other will be at 0. Also, in FIG. 7 where a lead is labeled +5VDC this indicates a positive voltage is present on the lead which is tantamount to being at a 1 condition. A grounded lead on the other hand indicates a 0 condition. It is apparent therefore from what has been said that the first start signal 28 operates to cause the counter to commence counting at the 4 rate and the first stop pulse 30 changes the counting rate to a counting rate of 3, the second stop pulse 30 changes the counting rate to a counting rate of 2, the third stop pulse 30 changes the counting rate to a counting rate of 1, and the fourth stop pulse 30 ends counting. Obviously, as explained the present circuit invention could be used to commence counting at other rates as well.

The AND gates, the NOR gates, the use of expander connectons, and the construction and operation of the j–k flip-flops can all be conventional and since such devices and their operations are well known, it is not deemed necessary to described them in detail beyond what has already been said.

The other elements shown in FIG. 7 operate in their usual manners under control of signals received from the control portion of the circuit as shown in FIG. 6. For example the enable/inhibit gate circuit 80 is shown formed by four parallel connected AND gates 90, 112, 114 and 116 each of which has inputs. Some of the inputs to these gates are connected to the various real and false outputs of the circuit of FIG. 6, several are maintained at a 1 condition by being connected to +5VDC sources, and all of the inputs to the gate 114 are grounded at 0. The outputs of the gates 90, 112, 114 and 116 are connected to respective inputs of NOR gate 118 which has its output connected to the j and k inputs of the flip-flop 88. The flip-flop 88 has another input 120 connected to a source of clock pulses and still another input 122 connected to a source of start signals. When the output of the NOR gate 118 is at 1 condition the flip-flop 88 will be enabled so that when it receives a start signal on connection 122 it will start counting inputs it receives on the clock input 120. However, when the output of the NOR gate is at 0 condition the flip-flop 88 will be inhibited and prevented from counting clock pulses.

The enable/inhibit gate circuit 98 is similar in construction to the gate circuit 80 in that it includes four AND gates 96, 126, 128 and 130 and NOR gate 132. In the case of the gate circuit 98 however, two of the AND gates 126 and 128 receive respectively the real and false outputs of the flip-flop 88 which is also referred to as the A flip-flop. The other inputs to the gate 98 are from outputs of the control circuit of FIG. 6 and from the +5VDC source. The output of the NOR gate 132 is connected to the $j$ and $k$ inputs of the flip-flop 84 which is also referred to as the B flip-flop. The flip-flop 84 has a clock input 134 and a start input and operates similar to the A flip-flop 88.

The third enable/inhibit gate circuit 82 is also similar in construction to the circuits 80 and 98 being formed by the four AND gates 100–106 and a NOR gate 136. The circuit 82 additionally has the fifth AND gate 108 which has connections to the expander inputs 138 and 140 of the NOR gate 136. It will be noted that the AND gates 120, 106 and 108 have other input connections to the real and false outputs of the A and B flip-flops 88 and 84 as shown. The output of the NOR gate 136 is connected to the $j$ and $k$ inputs of the C stage flip-flop 86 which flip-flop also has a clock input 142 and a start input 144. The real outputs produced by the flip-flop 86 are applied to the clock input of the remaining flip-flop stages 146 wherein the actual accumulating takes place as distinguished from the control functions described above. When the circuits of FIGS. 6 and 7 are interconnected in the manner as shown they operate to count and average in the manner described above and particularly in the manner outlined by the table of FIG. 5.

As already indicated the circuit as shown can be varied in many ways to change the way it operates and to increase or decrease its capacity. However the relatively simple circuit shown illustrates the principles involved including how one counter can be used to simultaneously accumulate and average.

Thus there has been shown and described a novel averaging counter construction which fulfills all of the objects and advantages sought therefor. It is apparent, however, from what has been said that many changes, variations, modifications and other uses and applications of the subject counter are possible and contemplated, and all such changes, variations, modifications and other uses and applications which do not depart from the spirit and scope of the invention are deemed to be covered by the invention which is limited only by the claims which follow.

What is claimed is:

1. Means to control a counter to simultaneously count and average comprising a multi-stage counter of M stages, each stage having input and output connections, said means including control gate means, the inputs of stage 1 through M having connections to said control gate means and the outputs of stages 1 through M−1 having connections to said control gate means, enable/inhibit means including start and stop inputs to enable or inhibit selected counter stages, said gate means and said enable/inhibit means, controlling the counter to cause the counter stages to count at a first preselected counting rate in response to receipt of a start signal at said start input, said enable/inhibit means connecting signals at said stop input thereof to said control gate means to effect a change in the counting rate of the multi-stage counter, said control gate means including means to selectively terminate the counting operation of predetermined counting stages upon receipt of a predetermined number of signals at said stop signal input.

2. The control means define in claim 1 including means to change the counting rate of the multi-stage counter by a predetermined amount upon receipt of each signal at said stop signal input.

3. The control means defined in claim 1 including means to effect a change in the counting rate by an integer (1, 2, 3, . . .) each time a signal is received at said stop signal input.

4. Means to control a counter to enable the counter to average a plurality of signals comprising:

a multi-stage binary counter having a plurality of serially connected binary stages, each stage having an input, a clock input, and an output connection thereto, a first source of input control signals to which said plurality of signals are fed and;

control means for predeterminetly applying input control signals from said first source to input connections of selected stages of the binary counter, said input control signals determining the counting rate of said counter by controlling the response of said stages to clock pulses applied thereto, said control means also predeterminately changing input and output connections between the counter stages to which the input signals from said first source are applied to effect a change in the counting rate, the counter counting clock pulses at a counting rate which depends on how the counter stages have input control signals applied thereto, said means to predeterminately change the input and output connections between counter stages including a gated control circuit.

5. Means to simultaneously accumulate and average the times of arrivals of a plurality of input pulses with respect to a predetermined time comprising:

an averaging counter having a plurality of serially connected stages each having an input, an output, and a clock input for receiving common clock signals, means for enabling/inhibiting selected ones of the inputs of the counter stages to cause said counter to accumulate clock signals at preselected rates, said last named means also including a source of control signal pulses and means responsive to receipt of succeeding input pulses to enable/inhibit the inputs to the counter stages, each succeeding change effecting a change in the clock signal counting rate.

6. The means defined in claim 5 wherein said last named means to enable/inhibit include means to reduce the counting rate by an integer value (1, 2, 3, . . .) each time an input pulse is received.

7. The means defined in claim 5 wherein said last named means to enable/inhibit include a multi-stage bistable control circuit responsive to receipt of said input pulses, and gate circuit means operatively connected between the multi-stage control circuit and the stages of said averaging counter.

8. Means to average the times of arrival of a plurality of signals comprising:

a binary counter having a plurality of serially connected stages each having an input and an output and a clock input, each state of said counter being able to accumulate clock inputs at a rate that is a factor of two compared to the adjacent stages;

means for enabling selected stages of the binary counter to respond to adjacent stages, the stages selected in part determining the rate at which the counter counts the clock signals it receives;

input signal pulses whose times of arrivals after a predetermined time are to be averaged; and means responsive to receipt of the input signal pulses including means for enabling different combinations of the counter stages to respond to said clock signals to change the counting rate thereof.

9. The means defined in claim 8 wherein the binary counter accumulates increments received at its clock inputs at a lesser rate following receipt of each input signal pulse.

10. The means defined in claim 8 including means to establish an initial counting rate, a start signal establishing said predetermined time and means responsive to receipt of said start signal to establish an initial operative connection of said binary counter stages.

11. The means defined in claim 10 including means responsive to receipt of each input signal pulse to change the connections between the counter stage inputs in a way to reduce the counting rate of the binary counter by a predetermined factor.

12. A counter for counting a plurality of signals and producing the average thereof including:

a control register having a start input, a stop input, a plurality of at least N outputs where N equals the number of signals to be counted and averaged, and logic means to produce N+1 discrete combinations of predetermined control output signals at said plurality of N outputs;

a plurality of 1 through M counting elements each having an input for signals to be counted, a reset input, a complementary pair of outputs, and at least one control input, said counting elements including means responsive to signals at said control inputs to control the counting therewithin; and a plurality of 1 through M logic gates, each gate having an output connected to the control input of an adjacent counting element and inputs connected to predetermined control signal output signals from said control register, said gates 2 through M each also having input connections to the outputs of the preceding counting elements, whereby said logic gates and control register causes said counting elements to count at N minus the number of signals at said stop input times the signals to be counted so that the accumulation therein is N times the average number of signals to be counted.

* * * * *